United States Patent [19]

Manning

[11] Patent Number: 5,946,260
[45] Date of Patent: Aug. 31, 1999

[54] METHOD AND SYSTEM FOR STORING AND PROCESSING MULTIPLE MEMORY ADDRESSES

[75] Inventor: Troy A. Manning, Meridian, Id.

[73] Assignee: Micron Technology, Inc., Boise, Id.

[21] Appl. No.: 09/168,360

[22] Filed: Oct. 7, 1998

Related U.S. Application Data

[63] Continuation of application No. 08/874,973, Jun. 13, 1997, Pat. No. 5,825,711.

[51] Int. Cl.⁶ .............................. G11C 16/04; G11C 8/00
[52] U.S. Cl. ................................ 365/230.03; 365/230.06; 365/230.08; 365/189.05
[58] Field of Search ......................... 365/230.03, 230.06, 365/230.08, 233, 189.05, 239

[56] References Cited

U.S. PATENT DOCUMENTS

| | | | |
|---|---|---|---|
| 4,312,068 | 1/1982 | Goss et al. | 371/37.6 |
| 4,849,702 | 7/1989 | West et al. | 371/27.7 |
| 5,297,029 | 3/1994 | Nakai et al. | 365/238.5 |
| 5,321,700 | 6/1994 | Brown et al. | 371/27.6 |
| 5,390,224 | 2/1995 | Komatsuda | 377/56 |
| 5,402,390 | 3/1995 | Ho et al. | 365/225.7 |
| 5,471,430 | 11/1995 | Sawada et al. | 365/222 |
| 5,581,512 | 12/1996 | Kitamura | 365/233 |
| 5,600,605 | 2/1997 | Schaefer | 365/230.03 |
| 5,636,174 | 6/1997 | Rao | 365/230.03 |
| 5,640,354 | 6/1997 | Jang et al. | 365/201 |
| 5,652,733 | 7/1997 | Chen et al. | 365/233 |
| 5,732,041 | 3/1998 | Joffe | 365/230.08 |
| 5,737,563 | 4/1998 | Shigeeda | 365/230.03 |
| 5,764,584 | 6/1998 | Fukiage et al. | 365/230.03 |
| 5,831,929 | 11/1998 | Manning | 365/233 |

FOREIGN PATENT DOCUMENTS

| | | | |
|---|---|---|---|
| 0 486 480 A2 | 5/1992 | European Pat. Off. | B01D 21/26 |
| 0 605 887 A2 | 7/1994 | European Pat. Off. | G11C 7/00 |
| 197 34 719 A1 | 5/1998 | Germany | G11C 7/00 |
| 59-116829 | 7/1984 | Japan . | |
| 2 128 383 | 4/1984 | United Kingdom . | |
| WO 96/24935 | 8/1996 | WIPO | G11C 16/06 |

OTHER PUBLICATIONS

Descriptive literature entitled, "400MHz SLDRAM, 4M × 16 SLDRAM Pipelined, Eight Bank, 2.5 V Operation," SLDRAM Consortium Advance Sheet, published throughout the United States, pp. 1–22.

"Draft Standard for a High–Speed Memory Interface (SyncLinc)," Microprocessor and Microcomputer Standards Subcommittee of the IEEE Computer Society, Copyright 1996 by the Institute of Electrical and Electronics Engineers, Inc., New York, NY, pp. 1–56.

*Primary Examiner*—Trong Phan
*Attorney, Agent, or Firm*—Seed and Berry LLP

[57] ABSTRACT

A packetized dynamic random access memory ("DRAM") receives command packets each of which contain a plurality of command words. One of the command words in each command packet includes a column address. Each of the command words, including the column address, is stored in one of a plurality of storage units so that a plurality of column addresses may be simultaneously stored in the storage units. The column addresses are individually coupled from respective storage units to a common column address bus which includes an address latch. The column address bus drives a column address processing circuit, such as a column address decoder. Also included is an adder that allows the DRAM to operate in a burst mode. In response to receiving an increment signal, the adder increments the column address at the output of the column address bus and applies the incremented address to the input of the column address bus.

54 Claims, 4 Drawing Sheets

METHOD AND SYSTEM FOR STORING AND PROCESSING MULTIPLE MEMORY ADDRESSES

This application is a continuation of pending U.S. patent application Ser. No. 08/874,973, filed Jun. 13, 1997, which is now U.S. Pat. No. 5,825,711.

TECHNICAL FIELD

This invention relates to memory devices used in computer systems, and, more particularly, to a memory address register for storing multiple memory addresses for subsequent processing.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium Pro® microprocessors are currently available that operate at clock speeds of at least 200 MHz. However, the remaining components of existing computer systems, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a lower clock frequency that is substantially lower than the clock frequency of the processor. Similarly, the bus bridge allows the input devices, output devices, and data storage devices to operate at a substantially lower frequency. Currently, for example, a processor having a 200 MHz clock frequency may be mounted on a mother board having a 66 MHz clock frequency for controlling the system memory devices and other components.

Access to system memory is a frequent operation for the processor. The time required for the processor, operating, for example, at 200 MHz to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor directly through the processor bus, although it may also be coupled to the processor through a memory controller. Rather than requiring that separate address and control signals be provided to the system memory, SyncLink memory devices receive command packets that include both control and address information. The SyncLink memory device then outputs or receives data on a data bus that may be coupled directly to the data bus portion of the processor bus.

An example of a computer system 10 using a SyncLink packetized DRAM architecture is shown in FIG. 1. The computer system 10 includes a processor 12 having a processor bus 14 coupled to three memory devices 16a–c, such as packetized dynamic random access memory or SyncLink DRAMs ("SLDRAM") devices, either directly (as shown) or through a memory controller or the like (not shown). The computer system 10 also includes one or more input devices 20, such as a keypad or a mouse, coupled to the processor 12 through a bus bridge 22 and an expansion bus 24, such as an industry standard architecture ("ISA") bus or a peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 30 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c through a data bus portion of the processor bus 14. Although all the memory devices 16a–c are coupled to the same conductors of the processor bus 14, only one memory device 16a–c at a time reads or writes data, thus avoiding bus contention on the processor bus 14. Bus contention is avoided by each of the memory devices 16a–c and the bus bridge 22 having a unique identifier, and the command packet contains an identifying code that selects only one of these components.

The computer system 10 also includes a number of other components and signal lines that have been omitted from FIG. 1 in the interests of brevity. For example, as explained below, the memory devices 16a–c also receive a master clock signal to provide internal timing signals, a data clock signal clocking data into and out of the memory device 16, and a FLAG signal signifying the start of a command packet.

One of the memory devices 16 is shown in block diagram form in FIG. 2. The memory device 16 includes a clock divider and delay circuit 40 that receives a master clock signal 42 and generates a large number of other clock and timing signals to control the timing of various operations in the memory device 16. The memory device 16 also includes a command buffer 46 and an address capture circuit 48 which receive an internal clock CLK signal, a command packet CA0–CA9 on a command bus 50, and a FLAG signal on line 52. As explained above, the command packet contains control and address information for each memory transfer, and the FLAG signal identifies the start of a command packet. The command buffer 46 receives the command packet from the bus 50, and compares at least a portion of the command packet to identifying data from an ID register 56 to determine if the command packet is directed to the memory device 16 or some other memory device 16. If the command buffer 46 determines that the command is directed to the memory device 16a, it then provides the command to a command decoder and sequencer 60. The command decoder and sequencer 60 generates a large number of internal control signals to control the operation of the memory device 16 during a memory transfer corresponding to the command.

The address capture circuit 48 also receives the command packet from the command bus 50 and outputs a 20-bit address corresponding to the address information in the command. The address is provided to an address sequencer 64 which generates a corresponding 3-bit bank address on bus 66, an 11-bit row address on bus 68, and a 6-bit column address on bus 70.

One of the problems of conventional DRAMs is their relatively low speed resulting from the time required to precharge and equilibrate circuitry in the DRAM array. The packetized DRAM device 16a shown in FIG. 2 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time as determined by bank control logic 94 as a function of bank data from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80a–h through sense amplifiers 104. Data is coupled to or from the memory banks 80a–h through the sense amplifiers 104 and I/O gating circuit 102 to a data path subsystem 108 which includes a read data path 110 and a write data path 112. The read data path 110 includes a read latch 120 receiving and storing data from the I/O gating circuit 102. In the memory device 16a shown in FIG. 2, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked through the FIFO buffer 124 by a clock signal generated from an internal clock by a programmable delay circuit 126.

The FIFO buffer 124 sequentially applies the 16-bit words and two clock signals (a clock signal and a quadrature clock signal) to a driver circuit 128 which, in turn, applies the 16-bit data words to a data bus 130 forming part of the processor bus 14. The driver circuit 128 also applies the clock signals to a clock bus 132 so that a device, such as the processor 12 (FIG. 1) reading the data on the data bus 130, can be synchronized with the data.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifier 104.

As mentioned above, an important goal of the SyncLink architecture is to allow data transfer between a processor and a memory device to occur at a significantly faster rate. However, the operating rate of a packetized DRAM, including the packetized DRAM device 16a shown in FIG. 2, is limited by the time required to process addresses applied to the memory device 16a as part of each command packet For example, not only must the column addresses be received and stored in the address sequencer 64, but they must also be latched and decoded in the column latch/decoder 100 and used to generate a variety of column access signals. The rate at which command packets can be provided to the memory device 16a is thus limited by the time required to store and processes the addresses in the command packets.

Although the foregoing discussion is directed to the need for faster address processing in packetized DRAMs, similar problems exist in other memory devices, such as asynchronous DRAMs and synchronous DRAMs, which must process addresses and other signals at a high rate of speed. Thus, for the reasons explained above, the limited operating speed of conventional address processing circuits threatens to severely limit the maximum operating speed of memory devices, particularly packetized DRAMs. Therefore, there is a need to be able to receive addresses, particularly addresses in command packets, at a rate that is faster than the rate that the addresses, particularly the column addresses, can be processed.

SUMMARY OF THE INVENTION

A system and method for storing and processing memory address, such as column addresses in a dynamic random access memory ("DRAM"). A plurality of address storage units each store a respective memory address responsive to an input enable signal. As a result, a plurality of column addresses may be simultaneously stored in the memory device. The address storage units each apply its stored address to an M-bit bus responsive to an output enable signal. Each of the bits of the M-bit bus is coupled to a corresponding bit of all of the address storage units. The M-bit bus is coupled to a memory address processing circuit, such as an address decoder circuit, by an address bus circuit for each of the M-bits. An adder may be included to facilitate the DRAM operating in a burst mode. The adder has a plurality of input terminals that are coupled to respective output terminals of the address bus circuits, and a plurality of output terminals that are coupled to respective input terminals of the address bus circuits. The adder applies to the input terminals of the address bus circuits a memory address that is a predetermined number, such as one, greater than a memory address received from the output terminals of the address bus circuits. The memory address storing and processing system is particularly adapted for use in a packetized DRAM which may then be used as part of a computer system.

DETAILED DESCRIPTION OF THE INVENTION

Figure 1:
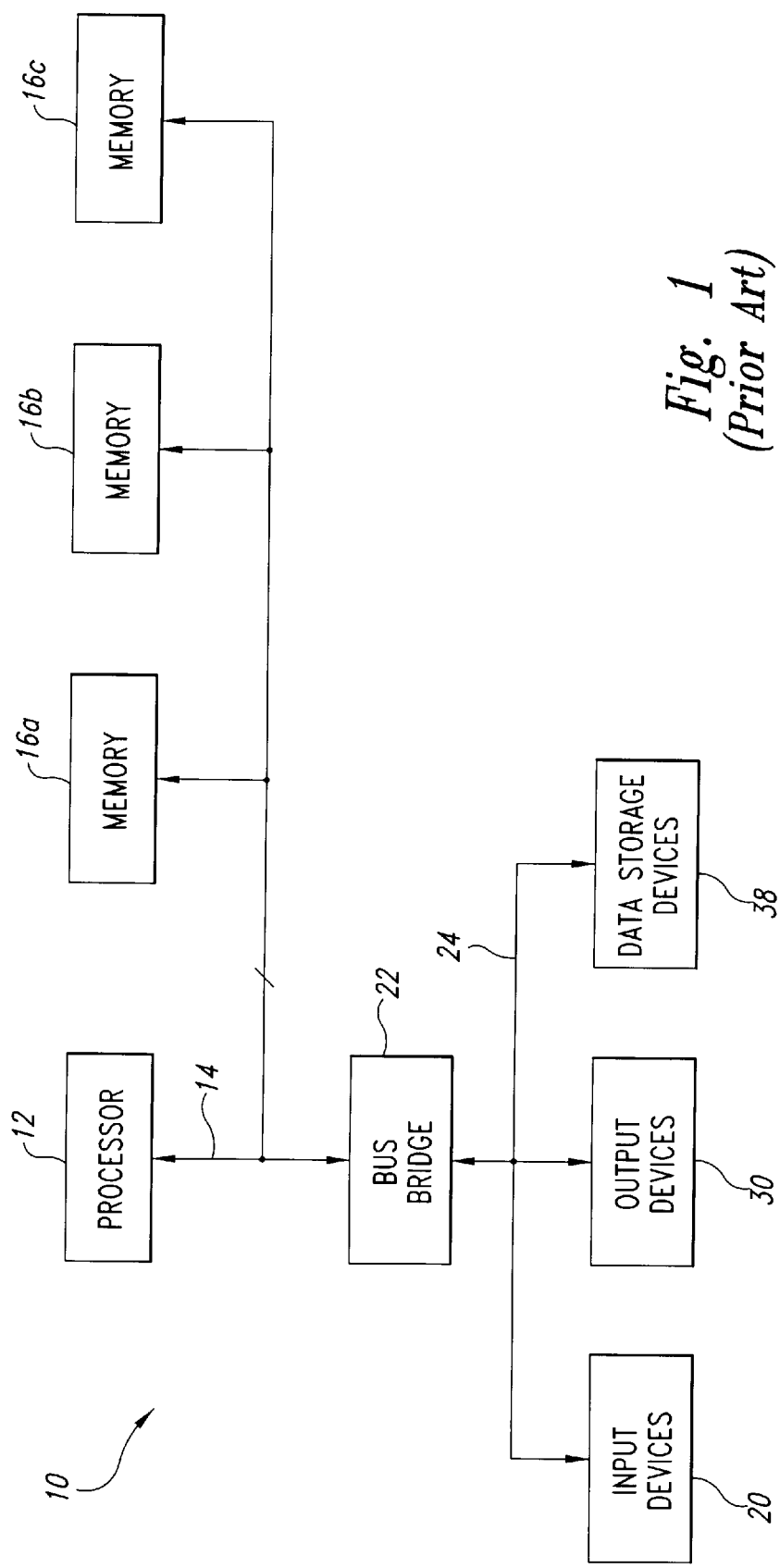
FIG. 1 is a block diagram of a computer system using SyncLink architecture.
Figure 2:
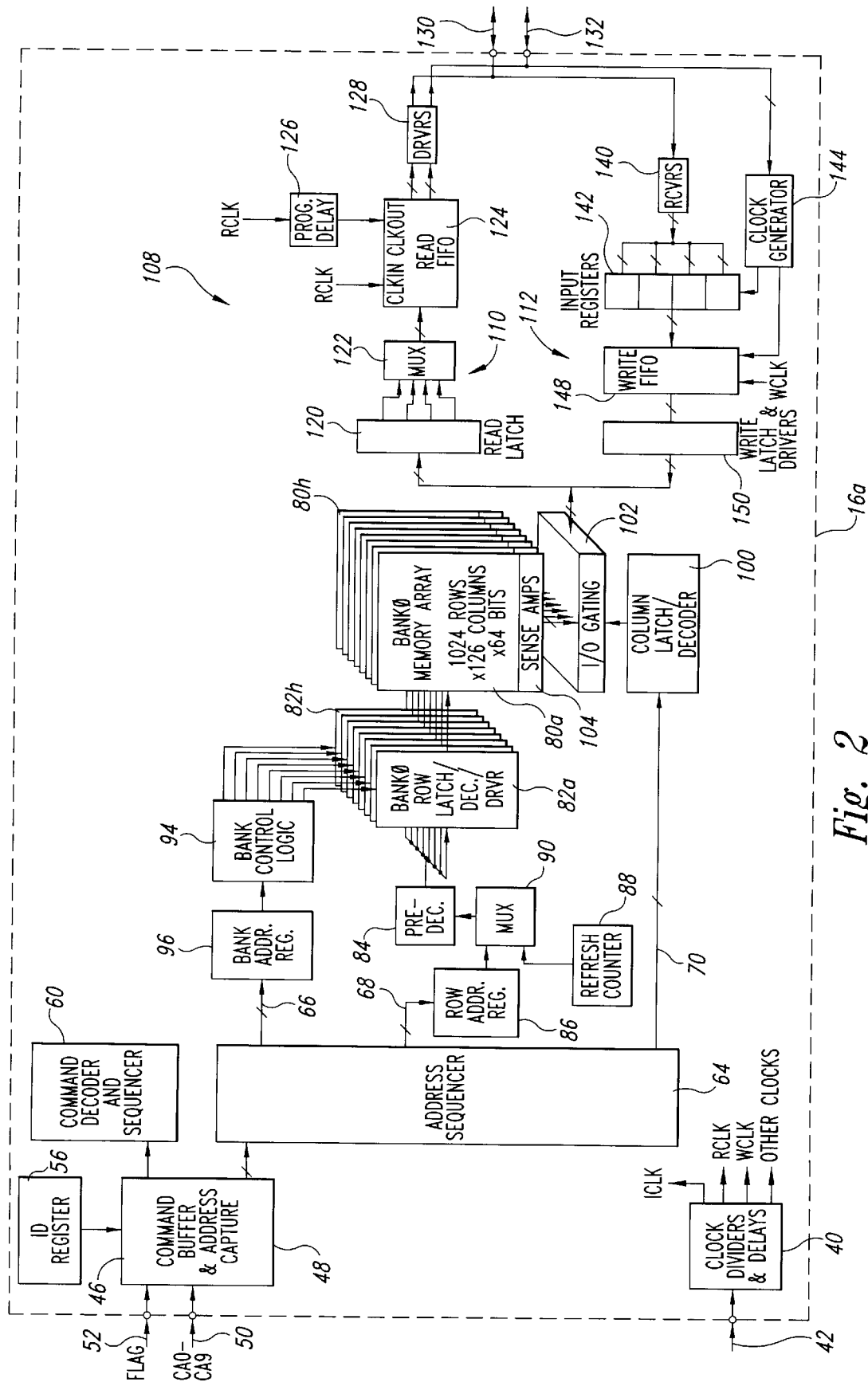
FIG. 2 is a block diagram of a packetized DRAM that may be used in the computer system of FIG. 1.
Figure 3:
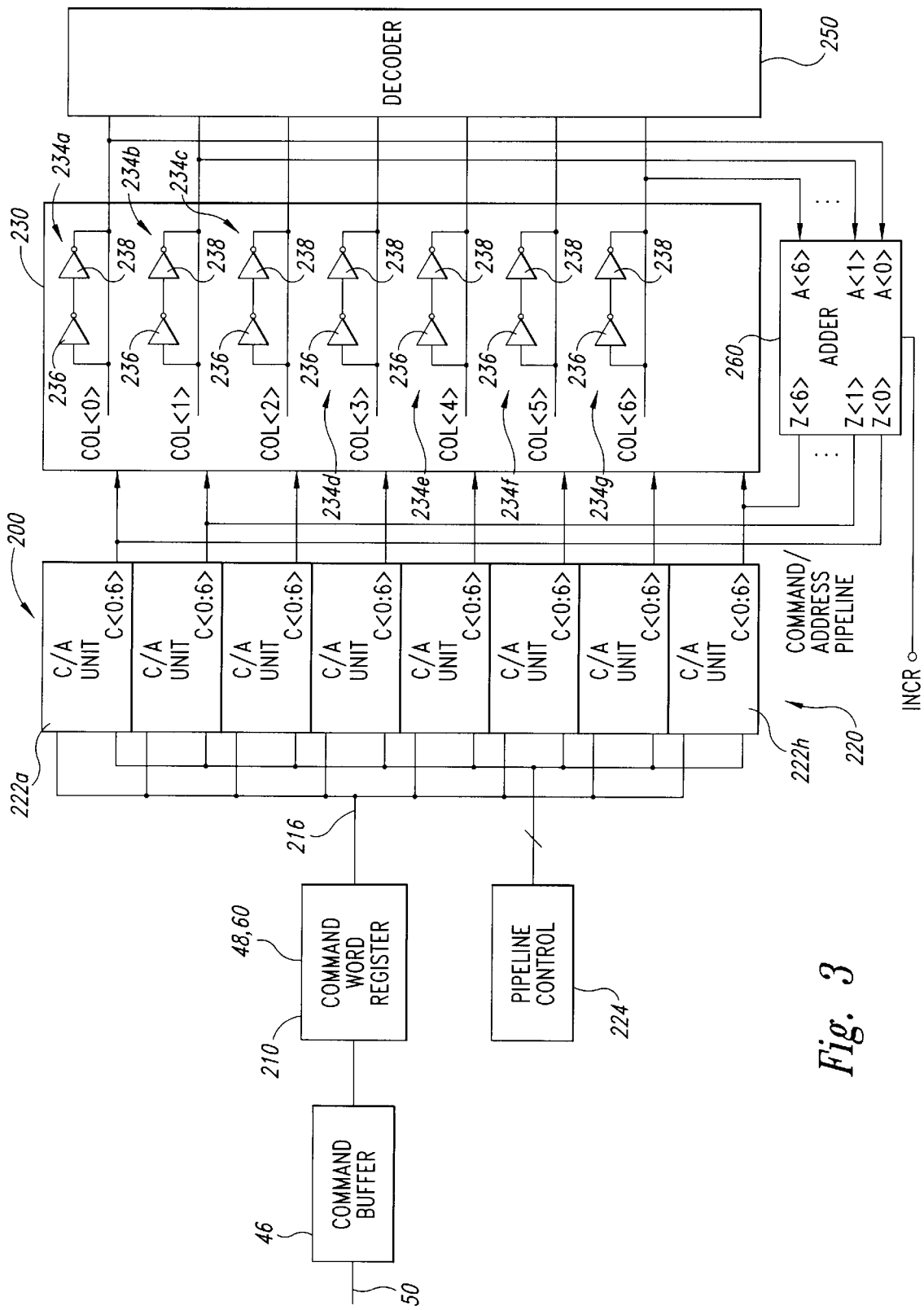
FIG. 3 is a block diagram of a portion of an embodiment of an address sequencer in accordance with the present invention that is usable in the packetized DRAM of FIG. 2, shown with a command buffer and address capture circuit coupling command packets to the sequencer.

One embodiment of an address sequencer 200 in accordance with the present invention that is usable in the packetized DRAM of FIG. 2 is shown in FIG. 3. The address sequencer 200 is shown with the command buffer 46 and address capture circuit 48 coupling command packets to the address sequencer 200. The address sequencer 200 can be used in place of the address sequencer 64 in the packetized DRAM of FIG. 2, and the resulting memory device may be used in the computer system shown in FIG. 1.

With reference to FIG. 3, the command buffer 46 is preferably implemented with a shift register that sequentially stores each of a plurality of command words in a command packet. The command packets are applied to the command buffer 46 though the command bus 50. After one or more command words have been stored in the command buffer 46, they are transferred to a command word register 210. In the embodiment shown in FIG. 3, the command words stored in the command word register 210 contain commands, addresses, and identifying information. The command word register 210 thus implements both the address capture circuit 48 and a capture circuit for these other components of the command packets. However, it will be understood that a separate address capture circuit may also be used, and another circuit (not shown) can be used to capture the other components of the command packet.

The command word register 210 shown in FIG. 3 stores all of the command words in a command packet after they have been shifted into the command buffer 46. Thus, where each command packet contains 4 command words, all 4 command words are shifted into the command buffer 46 before being transferred to the command word register 48. However, it will be understood that the command word register 48 may store only a portion of the command words in each command packet after they have been stored in the command buffer 46. For example, where each command packet contains 4 command words, the command words may be transferred to the command word register 48 after only 2 command words have been shifted into the command buffer 46. After the remaining 2 command words have been shifted into the command buffer 46, they can be transferred to the same command word register 48 or a different command word register so that each of 2 command word registers stores respective sets of 2 command words. In any case, the command word register 48 preferably outputs all 4 command words in each command packet on an output bus 216. Where the command packet consists of 4 10-bit words, the output bus will be 40 bits wide. Some of these bits constitute a column address for designating a column of one of the arrays 80 (FIG. 2) for a memory transfer. In the embodiment illustrated in FIG. 3, 7 bits of the output bus 216 contain a column address COL<0:6>.

The COL<0:6> bits from the command word register 48 are applied to a Command/Address Pipeline 220 composed of a series of command/address storage ("C/A") units 222a–h. As the command words from each of the command packets are applied to the output bus 216 of the command word register 210, they are selectively latched in one of the C/A storage units 222a–h by a respective latch signal generated by a pipeline control circuit 224. The pipeline control circuit 224 causes the command words from each of the command packets to be stored in one of the C/A storage units 222a–h by a suitable protocol, as will be apparent to one skilled in the art. For example, the command words may be stored in the first of the C/A storage unit 222 that does not already contain a column address C<0:6>. The pipeline control circuit 224 also enables the C/A storage units 222 to output respective column address COL<0:6> stored in the C/A storage unit 222. Only one C/A storage unit 222 is enabled to provide a COL<0:6> output at any single time.

The above discussion of the C/A storage units 222 deals primarily with their function of storing respective column addresses COL<0:6>. However, the C/A storage units 222 also preferably store the remaining portions of the command words, which include a bank address, a row address, a command (e.g., read, write, etc.), and identifying information designating the memory device 16 to which the command packet is directed. However, a discussion of these other portions of the command words will be omitted for purposes of brevity since they are not central to an understanding of the disclosed embodiment of the inventive method and system for storing and processing addresses.

The use of multiple C/A storage units 222, each of which stores a respective column address, provides significant advantages to increase the speed of the memory device 16. In conventional DRAMs and known architectures for packetized DRAMs, the DRAM cannot receive a column address for a memory operation until the prior column address has been latched and processed, such as by decoding the address. By using multiple C/A storage units 222, memory device 16 containing the address sequencer 200 of FIG. 3 can continue to receive column addresses even though one or more prior column addresses have not yet been processed, such as by decoding the column addresses. In fact, the address sequencer 200 can receive column addresses as long as the average rate at which the column addresses are received is less than the average time to process the addresses and complete memory transfer operations. As a result, memory devices, and particularly packetized DRAMs, using the address sequencer 200 of FIG. 3 are capable of operating at a relatively high speed.

The column addresses COL<0:6> present at the output of the C/A storage units 222 are applied to a column address latch 230 that is composed of one latch circuit 234a–g for each bit of the column address COL<0:6>. Each latch circuit 234a–g is composed of a pair of inverters 236, 238. The output impedance of the inverters 238 is higher than the output impedance of the C/A storage units 222 so that the C/A storage units 222, rather than the inverters 238, control the logic level at the inputs to the inverters 236. Thus, when a logic level (ie., an logic "1" or "1") is applied to the input of one of the inverters 236, that same logic level is generated at the output of the inverter 238, thereby holding the input to the inverter 236 at that logic level after the previously enabled C/A storage unit 222 is no longer enabled.

As mentioned above, one latch 234a–g is provided for each column address bit COL<0:6>. Thus, the COL<0> bit from each of the C/A storage units 222 is coupled to the latch 234a, the COL<1> bit from each of the C/A storage units 222 is coupled to the latch 234b, etc. However, as also mentioned above, only one of the C/A storage units 222 is enable by the pipeline control circuit 224 at any one time. As a result, the latches 234a–g receive a signal from only one C/A storage unit 222 at a time.

The column address COL<0:6> at the output of the column address latch 230 is then processed, such as by applying it to a column decoder 250 which may be of a conventional or subsequently developed design.

The column address latch 230 is adapted to interface with an adder 260 in a "burst" mode of operation. In a burst memory access, the column address from one of the C/A storage units 222 designates a starting address for the memory access. Thereafter, a plurality of memory accesses from the memory cells occur incrementing from the column address without the need for one of the C/A storage units 222 to receive and apply additional column addresses to the column address latch 230. In a bust mode access, a high INCR signal is applied to the adder 260. The adder 260 then latches the column addresses applied to the A<0:6> inputs from respective COL<0:6> outputs of the column address latch 230. The adder 260 then increments the column address by one and applies the incremented column address to its Z<0:6> outputs. The Z<0:6> outputs of the adder 260 are coupled to respective COL<0:6> inputs to the column address latch 230. As a result, the column address latch 230 receives the incremented column address.

Figure 4:
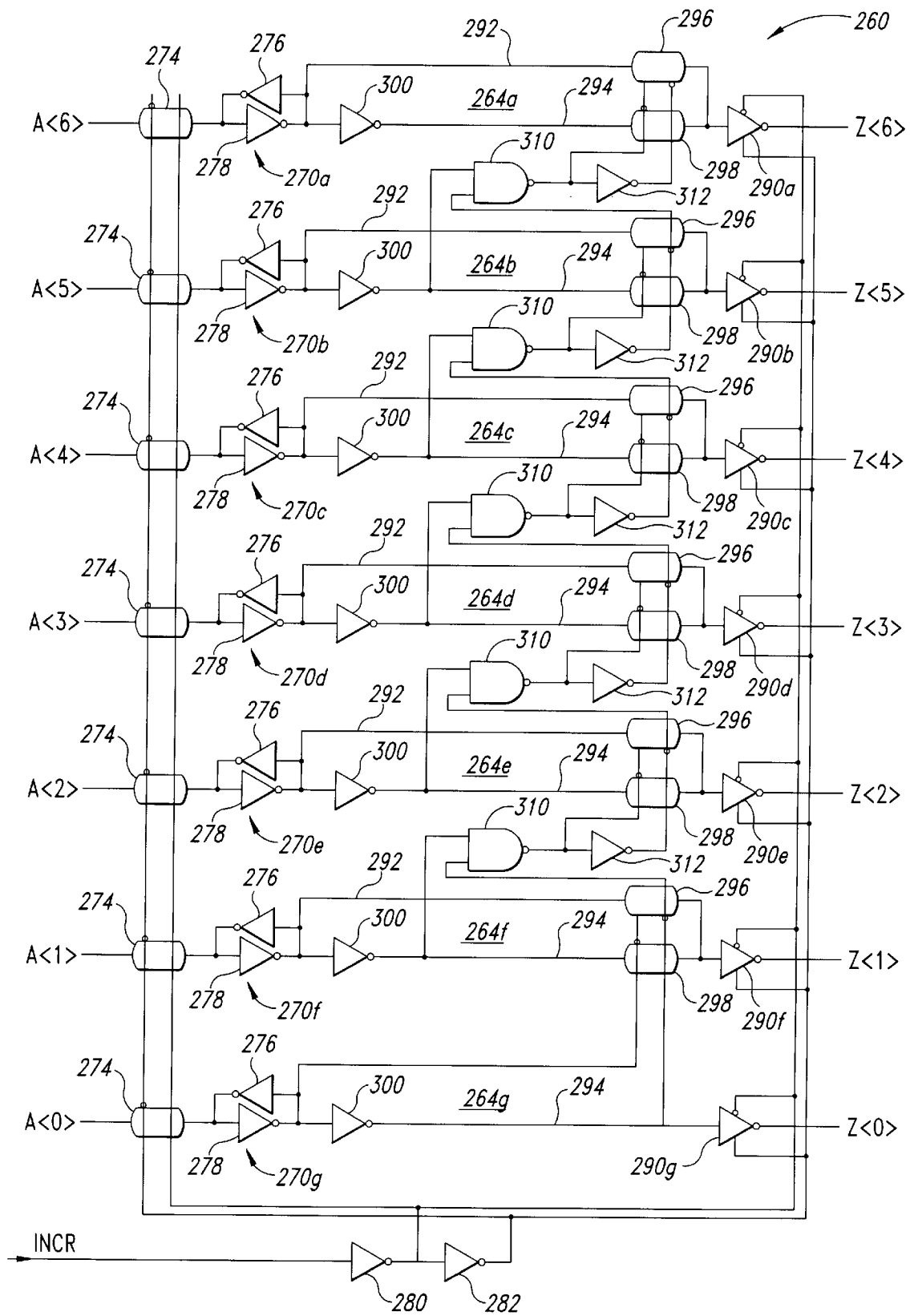
FIG. 4 is a logic diagram of a column incrementer used in the sequencer of FIG. 3

A logic diagram of the adder 260 is shown in FIG. 4. The adder operates on the principle that a multi-bit digital word may be incremented by 1 simply by inverting a bit and all bits of lesser significance if all bits lesser significance than that bit are logic "1". Thus, for example, if the column address is "100111" the column address can be incremented by 1 simply by inverting bits 3:0 to obtain "101000".

With reference to FIG. 4, the adder 260 includes a plurality of adder circuits 264a–g, one for each of the seven bits of the column address COL<0:6>. Each of the adder circuits 264a–g includes an input latch 270a–g, respectively, formed by a conventional pass gate 274 and a pair of inverters 276, 278 connected input-to-output. The pass gates 264 are enabled by a high at the output of an inverter 280 and a low at the output of an inverter 282. The input of the inverter 280 is receives the INCR signal so that the pass gates 264 are enabled whenever the INCR is low. Thus, the column address applied to the A<0:6> inputs of the adder 260 is latched on the rising edge of the INCR signal when the pass gates 264 become disabled.

Each of the adder circuits 264a–f, except the adder circuit 264g for the least significant address bit, includes two paths from its input latch 270a–f to a respective tri-state inverter 290a–f, namely a non-inverting path 292 and an inverting path 294. The adder circuit 264g for the least significant address bit includes only an inverting path 294. The non-inverting path 292 is selected by a first pass gate 296 while the inverting path 294 is selected by a second pass gate 298. Each inverting path 294 includes an inverter 300 connected between the input latch 270 and its pass gate 298 so that there are an odd number of inverters from the input A to the output Z of the adder circuits 264. The non-inverting path 294 has a direct connection from the input latch 270 to its pass gate 298 so that there are an odd number of inverters from the input to the output of the adder circuit 264. The tri-state inverters 290a–g are enabled by low at the output of the inverter 280 and a high at the output of the inverter 282, which occurs whenever the INCR signal is high.

The pass gates 296, 298 selecting either the non-inverting path 292 or the inverting path 294, respectively, in each of the adder circuits 264a–f are each controlled by a respective NAND gate 310 and an inverter 312 which is driven by the output of the NAND gate 310. The NAND gates 310 each receive the output of its respective inverter 300 (which has the same logic level as the input to the adder circuit 264) and an input indicative of the logic level of all column address bits of lesser significance. The pass gate 298 for the inverting path is selected whenever both of the inputs to the NAND gate 310 are logic "1." Thus, the pass gate 298 is enabled to select the inverting path 294 in the adder circuit 264f for the second least significant bit if both the input to the adder circuit 264f for that bit and the input to the adder circuit 264g for the least significant bit are both logic "1". An input of "11" thus produces an output of "00" since the inverting path 294 was selected for the second least significant bit while the inverting path 294 is always used for the least significant bit. Similarly, the pass gate 298 is enabled to select the inverting path 294 in the adder circuit 264d for the fourth least significant bit if both the input to the adder circuit 264d for that bit and the output of the inverter 312 in the adder circuit 264e are both logic "1." The output of the inverter 312 for any adder circuit 264 will be logic "1" if the outputs of the adder circuits 264 for all bits of lesser significance are logic "1." Thus, an input of "0111" produces an output of "1000" since the inverting paths 294 were selected for the fourth, third, second, and first least significant bits.

As mentioned above, the address sequencer 200 shown in FIGS. 3 and 4 may be used as the address sequencer 64 in the packetized DRAM that is shown in FIG. 2. The resulting memory device may be used in the computer system shown in FIG. 1 to provide superior operating speed. While the invention has been described herein by way of exemplary embodiments, various modifications may be made without departing from the spirit and scope of the invention. Accordingly, the invention is not limited except as by the appended claims.

I claim:

1. A system for storing and processing a plurality of command packets each of which contain a plurality of command words, at least one of the command words containing at least one memory address, the system comprising:

a command buffer receiving and storing a predetermined number of command words of each command packet;

at least one command word register coupled to the command buffer, the command words being transferred from the command buffer to the command word register after the predetermined number of command words have been stored in the command buffer;

an address pipeline having an input bus coupled to the command word register, the address pipeline having an plurality of address storage units each of which stores a respective memory address applied to the input bus responsive to a respective input enable signal, each of the address storage units applying its stored address to an output bus of the address pipeline responsive to a respective output enable signal;

a control circuit selectively applying the respective input enable signals and output enable signals to each of the address storage units; and a memory address processing circuit coupled to the output bus of the address pipeline.

2. The storing and processing system of claim 1, wherein the memory address processing unit comprises an address decoder.

3. The storing and processing system of claim 1 further comprising a latch having an input bus coupled to the output bus of the address pipeline to receive each one of the memory addresses stored in the address storage units and an output bus coupled to the memory address processing circuit to process a memory address stored in the latch.

4. The storing and processing system of claim 1 further comprising a plurality of address bus circuits each of which is coupled to a respective bit of the output bus, the bus circuits coupling the memory address from an enabled address storage unit to the memory address processing circuit.

5. The storing and processing system of claim 4 wherein the address bus circuits each comprises a latch having an input coupled to a respective bit of the output bus and an output coupled to the memory address processing circuit.

6. The storing and processing system of claim 1, further comprising an adder for allowing the storing and processing system to operate in a burst mode, the adder having an input bus coupled to the output bus of the address pipeline and an output bus coupled to the memory address processing circuit, the adder generating a series of addresses that increment from an initial address stored in the address pipeline.

7. The storing and processing system of claim 1 wherein the memory addresses stored in each of the address storage units of the address pipeline comprise respective addresses of columns of memory cell in at least one memory array.

8. A memory device, comprising:

at least one array of memory cells adapted to store data at a location determined by a row address and a column address;

a row address circuit adapted to select a row of memory cells in the array corresponding to a row address applied to the row address circuit;

a column address circuit adapted to select a column of memory cells in the array corresponding to a column address applied to the column address circuit;

a data path circuit adapted to couple data between an external terminal and a memory cell in the row and column of the array corresponding to the row and column address applied to the row address circuit and the column address circuit, respectively;

a command buffer adapted to receive a memory command to control the operation of the memory device;

an address buffer adapted to receive row addresses and column addresses applied to the address buffer;

an address pipeline having an input bus coupled to the address buffer, and a plurality of address storage units each of which stores a respective address applied to the input bus responsive to a respective input enable signal, each of the address pipelines applying its stored address to an output bus of the address pipeline responsive to a respective output enable signal;

a memory address processing circuit coupled to the output bus of the address pipeline; and a control circuit selectively applying the respective input enable signals and output enable signals to each of the address storage units.

9. The memory device of claim 8, wherein the memory address processing unit comprises an address decoder.

10. the memory device of claim 8 further comprising a latch having an input bus coupled to the output bus of the address pipeline to receive each one of the memory addresses stored in the address storage units and an output bus coupled to the memory address processing circuit to process a memory address stored in the latch.

11. The memory device of claim 8 further comprising a plurality of address bus circuits each of which is coupled to a respective bit of the output bus, the bus circuits coupling the memory address from an enabled address storage unit to the memory address processing circuit.

12. The memory device of claim 11 wherein the address bus circuits each comprises a latch having an input coupled to a respective bit of the output bus and an output coupled to the memory address processing circuit.

13. The memory device of claim 8, further comprising an adder for allowing the memory device to operate in a burst mode, the adder having an input bus coupled to the output bus of the address pipeline and an output bus coupled to the memory address processing circuit, the adder generating a series of addresses that increment from an initial address stored in the address pipeline.

14. The memory device of claim 8 wherein the memory addresses stored in each of the address storage units of the address pipeline comprise respective addresses of columns of memory cells in the array of memory cells.

15. A memory device, comprising:

at least one array of memory cells adapted to store data at a location determined by a tow address and a column address;

a row address circuit adapted to select a row of memory cells in the array corresponding to a row address applied to the row address circuit;

a column address circuit adapted to select a column of memory cells in the array corresponding to a column address applied to the column address circuit;

a data path circuit adapted to couple data between an external terminal and a memory cell in the row and column of the array corresponding to the row and column address applied to the row address circuit and the column address circuit, respectively;

a command buffer adapted to receive a plurality of command packets each of which contain a plurality of command words, at least one of the command words containing at least one memory address;

at least one command word register coupled to the command buffer, the command words being transferred from the command buffer to the command word register after the predetermined number of command words have been stored in the command buffer;

an address pipeline having an input bus coupled to the command word register, the address pipeline having a plurality of address storage units each of which stores a respective memory address applied to the input bus responsive to a respective input enable signal, each of the address storage units applying its stored address to an output bus of the address pipeline responsive to a respective output enable signal;

a control circuit selectively applying the respective input enable signals and output enable signals to each of the address storage units; and a memory address processing circuit coupled to the output bus of the address pipeline.

16. The memory device of claim 15, wherein the memory address processing unit comprises an address decoder.

17. The memory device of claim 15 further comprising a latch having an input bus coupled to the output bus of the address pipeline to receive each one of the memory addresses stored in the address storage units and an output bus coupled to the memory address processing circuit to process a memory address stored in the latch.

18. The memory device of claim 15 further comprising a plurality of address bus circuits each of which is coupled to a respective bit of the output bus, the bus circuits coupling the memory address from an enabled address storage unit to the memory address processing circuits.

19. The memory device of claim 18 wherein the address bus circuits each comprises a latch having an input coupled to a respective bit of the output bus and an output coupled to the memory address processing circuit.

20. The memory device of claim 15, further comprising an adder for allowing the storing and processing system to operate in a burst mode, the adder having an input bus coupled to the output bus of the address pipeline and an output bus coupled to the memory address processing circuit, the adder generating a series of addresses that increment from an initial address stored in the address pipeline.

21. The memory device of claim 15 wherein the memory addresses stored in each of the address storage units of the address pipeline comprise respective addresses of columns of memory cells in at least one memory array.

22. A computer system, comprising:
processor having a processor bus;
an input device coupled to the processor through the processor bus and adapted to allow data to be entered into the computer system;
an output device coupled to the processor through the processor bus adapted to allow data to be output from the computer system; and
a memory device coupled to the processor through the processor bus, comprising:
at least one array of memory cells adapted to store data at a location determined by a row address and a column address;
a row address circuit adapted to select a row of memory cells in the array corresponding to a row address applied to the row address circuit;
a column address circuit adapted to select a column of memory cells in the array corresponding to a column address applied to the column address circuit;
a data path circuit adapted to couple data between an external terminal and a memory cell in the row and column of the array corresponding to the row and column address applied to the row address circuit and the column address circuit, respectively;
a command buffer adapted to receive a memory command to control the operation of the memory device;
an address buffer adapted to receive row addresses and column addresses applied to the address buffer;
an address pipeline having an input bus coupled to the address buffer, and a plurality of address storage units each of which stores a respective address applied to the input bus responsive to a respective input enable signal, each of the address pipelines applying its stored address to an output bus of the address pipeline responsive to a respective output enable signal;
a memory address processing circuit coupled to the output bus of the address pipeline; and
a control circuit selectively applying the respective input enable signals and output enable signals to each of the address storage units.

23. The computer system of claim 22, wherein the memory address processing unit comprises an address decoder.

24. The computer system of claim 22 further comprising a latch having an input bus coupled to the output bus of the address pipeline to receive each one of the memory addresses stored in the address storage units and an output bus coupled to the memory address processing circuit to process a memory address stored in the latch.

25. The computer system of claim 22 further comprising a plurality of address bus circuits each of which is coupled to a respective bit of the output bus, the bus circuits coupling the memory address from an enabled address storage unit to the memory address processing circuit.

26. The computer system of claim 25 wherein the address bus circuits each comprises a latch having an input coupled to a respective bit of the output bus and an output coupled to the memory address processing circuit.

27. The computer system of claim 22, further comprising an adder for allowing the memory device to operate in a burst mode, the adder having an input bus coupled to the output bus of the address pipeline and an output bus coupled to the memory address processing circuit, the adder generating a series of addresses that increment from an initial address stored in the address pipeline.

28. The computer system of claim 22 wherein the memory addresses stored in each of the address storage units of the address pipeline comprise respective addresses of columns of memory cells in the array of memory cells.

29. A computer system, comprising:
a processor having a processor bus;
an input device coupled to the processor through the processor bus and adapted to allow data to be entered into the computer system;
an output device coupled to the processor through the processor bus adapted to allow data to be output from the computer system; and
a memory device coupled to the processor through the processor bus, comprising:
at least one array of memory cells adapted to store data at a location determined by a row address and a column address;
a row address circuit adapted to select a row of memory cells in the array corresponding to a row address applied to the row address circuit;
a column address circuit adapted to select a column of memory cells in the array corresponding to a column address applied to the column address circuit;
a data path circuit adapted to couple data between an external terminal and a memory cell in the row and column of the array corresponding to the row and column address applied to the row address circuit and the column address circuit, respectively;
a command buffer adapted to receive a plurality of command packets each of which contain a plurality of command words, at least one of the command words containing at least one memory address;
at least one command word register coupled to the command buffer, the command words being transferred from the command buffer to the command word register after the predetermined number of command words have been stored in the command buffer;

an address pipeline having an input bus coupled to the command word register, the address pipeline having a plurality of address storage units each of which stores a respective memory address applied to the input bus responsive to a respective input enable signal, each of the address storage units applying its stored address to an output bus of the address pipeline responsive to a respective output enable signal;

a control circuit selectively applying the respective input enable signals and output enable signals to each of the address storage units, and a memory address processing circuit coupled to the output bus of the address pipeline.

30. The computer system of claim 29, wherein the memory address processing unit comprises an address decoder.

31. The computer system of claim 29 further comprising a latch having an input bus coupled to the output bus of the address pipeline to receive each one of the memory addresses stored in the address storage units and an output bus coupled to the memory address processing circuit to process a memory address stored in the latch.

32. The computer system of claim 29 further comprising a plurality of address bus circuits each of which is coupled to a respective bit of the output bus, the bus circuits coupling the memory address from an enabled address storage unit to the memory address processing circuit.

33. The computer system of claim 32 wherein the address bus circuits each comprises a latch having all input coupled to a respective bit of the output bus and an output coupled to the memory address processing circuit.

34. The computer system of claim 29, further comprising an adder for allowing the storing and processing system to operate in a burst mode, the adder having an input bus coupled to the output bus of the address pipeline and an output bus coupled to the memory address processing circuit, the adder generating a series of addresses that increment from an initial address stored in the address pipeline.

35. The computer system of claim 29 wherein the memory addresses stored in each of the address storage units of the address pipeline comprise respective addresses of columns of memory cells in at least one memory array.

36. A method of processing memory addresses in a memory device, comprising applying a plurality of memory addresses to the memory device, storing the memory addresses as they are received by the memory device so that a plurality of memory addresses may be simultaneously stored in the memory device; and processing each of the stored memory addresses.

37. The method of claim 36 wherein the step of processing each of the stored memory addresses comprises selectively decoding each of the stored memory addresses.

38. The method of claim 36, further comprising the step of conveying the memory addresses over a common signal path from a location where the step of storing the memory address is performed to the location where the step of selectively processing each of the stored memory addresses is performed.

39. The method of claim 36 wherein the memory addresses comprise addresses designating a column of at least one array of memory cells.

40. The method of claim 36 further comprising latching each of the memory addresses one-at-a-time after the memory addresses have been stored in the memory device, and wherein the act of processing each of the stored memory addresses comprises processing each of the memory addresses after each of the memory addresses have been latched.

41. The method of claim 36 further comprising:

latching one of the memory addresses after the memory address has been stored in the memory device; and sequentially incrementing the latched memory addresses to provide a plurality of memory addresses increasing in value from the latched memory address.

42. A method of storing and processing memory addresses embedded in respective packets, each packet containing M N-bit packet words, the method comprising:

sequentially receiving and storing each of the M packet words in a plurality of packets;

combining the M packet words in each packet into a corresponding M*N bit packet word;

storing a portion of each M*N bit packet word corresponding to the memory address for a plurality of packets so that a plurality of packet word portions corresponding to respective memory addresses may be simultaneously stored;

processing each of the packet word portions corresponding to respective memory addresses.

43. The method of claim 42 wherein the step of processing each of the packet word portions corresponding to respective memory addresses comprises selectively decoding each of the packet word portions.

44. The method of claim 42, further comprising the step of conveying the packet word portions over a common signal path from a location where the step of storing the packet word portions is performed to the location where the step of selectively processing each of the step of processing each of the packet word portions Is performed.

45. The method of claim 42 wherein the packet word portions comprises memory addresses designating a column of at least one array of memory cells.

46. The method of claim 42 further comprising latching each of the packet word portions one-at-a-time after the packet word portions have been stored, and wherein the act of processing each of the stored packet word portions comprises processing each of the packet word portions after each of the packet word portions have been latched.

47. The method of claim 42 further comprising:

latching one of the packet word portions after the packet word portion has been stored; and sequentially incrementing the latched packet word portion to provide a plurality of memory addresses increasing in value from the memory address corresponding to the latched packet word portion.

48. A system for storing and processing memory address, comprising an address pipeline having an input bus, an output bus, and a plurality of address storage units each of which stores a respective memory address, the address storage units each storing a memory address applied to the input bus responsive to a respective input enable signal and applying its stored address to the output bus responsive to a respective output enable signal;

a memory address processing circuit coupled to the output bus of the address pipeline; and a control circuit selectively applying the respective input enable signals and output enable signals to each of the address storage units.

49. The storing and processing system of claim 48, wherein the memory address processing unit comprises an address decoder.

50. The storing and processing system of claim 48 further comprising a latch having an input bus coupled to the output bus of the address pipeline to receive each one of the memory addresses stored in the address storage units and an output bus coupled to the memory address processing circuit to process a memory address stored in the latch.

51. The storing and processing system of claim 48 further comprising a plurality of address bus circuits each of which is coupled to a respective bit of the output bus, the bus circuits coupling the memory address from an enabled address storage unit to the memory address processing circuit.

52. The storing and processing system of claim 51 wherein the address bus circuits each comprises a latch having an input coupled to a respective bit of the output bus and an output coupled to the memory address processing circuit.

53. The storing and processing system of claim 48, further comprising an adder for allowing the storing and processing system to operate in a burst mode, the adder having an input bus coupled to the output bus of the address pipeline and an output bus coupled to the memory address processing circuit, the adder generating a series of addresses that increment from an initial address stored in the address pipeline.

54. The storing and processing system of claim 48 wherein the memory addresses stored in each of the address storage units of the address pipeline comprise respective addresses of columns of memory cells in at least one memory array.

* * * * *

UNITED STATES PATENT AND TRADEMARK OFFICE
CERTIFICATE OF CORRECTION

PATENT NO. : 5,946,260  
DATED : August 31, 1999  
INVENTOR(S) : Manning

Page 1 of 1

It is certified that error appears in the above-identified patent and that said Letters Patent is hereby corrected as shown below:

Column 7,  
Line 6, reads "1" or "1" should read "1" or "0"

Signed and Sealed this

Thirtieth Day of October, 2001

Attest:

NICHOLAS P. GODICI  
Acting Director of the United States Patent and Trademark Office Attesting Officer